United States Patent
Rossi et al.

(10) Patent No.: US 9,176,191 B2
(45) Date of Patent: Nov. 3, 2015

(54) CONTINUITY TEST IN ELECTRONIC DEVICES WITH MULTIPLE-CONNECTION LEADS

(71) Applicant: STMICROELECTRONICS S.R.L., Agrate Brianza (IT)

(72) Inventors: Giorgio Rossi, Nerviano (IT); Carlo Caimi, Cinisello Balsamo (IT); Matteo Brivio, Cornate d'Adda (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 379 days.

(21) Appl. No.: 13/913,883

(22) Filed: Jun. 10, 2013

(65) Prior Publication Data

US 2013/0335107 A1    Dec. 19, 2013

(30) Foreign Application Priority Data

Jun. 18, 2012   (IT) .............................. MI2012A1059

(51) Int. Cl.
  *G01R 31/3187*   (2006.01)
  *G01R 31/28*     (2006.01)
  *H01L 21/66*     (2006.01)

(52) U.S. Cl.
  CPC ........ *G01R 31/3187* (2013.01); *G01R 31/2853* (2013.01); *H01L 22/34* (2013.01); *G01R 31/2884* (2013.01); *H01L 2224/48247* (2013.01); *H01L 2224/49113* (2013.01); *H01L 2224/49171* (2013.01); *H01L 2224/49175* (2013.01); *H01L 2924/13091* (2013.01)

(58) Field of Classification Search
  CPC . G01R 31/3187; G01R 31/2853; H01L 22/34
  See application file for complete search history.

(56) References Cited

U.S. PATENT DOCUMENTS

| | | | |
|---|---|---|---|
| 5,952,838 A * | 9/1999 | Tikhonov | ........... G01R 31/2884 324/756.05 |
| 6,100,710 A | 8/2000 | Monnot | |
| 6,240,535 B1 | 5/2001 | Farnworth et al. | |
| 2002/0110033 A1 | 8/2002 | Forbes | |
| 2007/0273396 A1 | 11/2007 | Matsumoto | |
| 2010/0045328 A1 | 2/2010 | Suto | |
| 2012/0097944 A1 * | 4/2012 | Lin | ........................ H01L 22/14 257/48 |

FOREIGN PATENT DOCUMENTS

| | | |
|---|---|---|
| DE | 102005029495 | 12/2006 |
| DE | 102006049324 | 4/2008 |

* cited by examiner

*Primary Examiner* — Tung X Nguyen
(74) *Attorney, Agent, or Firm* — Allen, Dyer, Doppelt, Milbrath & Gilchrist, P.A.

(57) ABSTRACT

An electronic device includes an electronic component having terminals including a set of first terminals and a set of second terminals, a protective package embedding the electronic component, leads exposed from the protective package including a set of first leads and a set of second leads, for each first lead a first electrical connection inside the protection package between the first lead and a corresponding one of the first terminals, and for each second lead electrical connections inside the protective package each one between the second lead and a corresponding one of the second terminals. For each second lead the electronic component includes test structures, each being coupled between a corresponding one of the second terminals connected to the second lead and a corresponding test one of the first terminals connected to a test one of the first leads.

26 Claims, 6 Drawing Sheets

CONTINUITY TEST IN ELECTRONIC DEVICES WITH MULTIPLE-CONNECTION LEADS

FIELD OF THE INVENTION

The invention relates to the electronics field. More specifically, this invention relates to the test of electronic devices with multiple-connection leads.

BACKGROUND OF THE INVENTION

An electronic device may comprise various electronic components (for example, non-volatile memories), which are typically integrated on die of semiconductor material. Each die is housed in a suitable package, which protects the die and at the same time allows access to the die. For this purpose, the package exposes several leads that are electrically connected to terminals of the die (for example, through corresponding connection wires).

The leads are normally of the single connection type, wherein each one of them is connected to a single terminal. However, some leads may also be of the multiple connection type (and in particular, of the double connection type), wherein each one of them is connected to two (or more) terminals. The multiple-connection lead is used to exchange signals in mutual exclusion with each one of its terminals. This allows a reduction of the number of leads of the package, and a reduction of the overall footprint of the entire electronic device.

Typically, an electronic device is subject to various test processes to ensure its correct operation. For example, a continuity test may be used to verify the integrity of the connection wires between the terminals and the leads. This allows sorting the electronic devices (by discarding the ones immediately defective) before performing next tests being more complex (for example, of the parametric or functional type). The continuity test is usually run during an open/short test, which is used to detect open-circuit/short-circuit conditions at the leads of the electronic device. For this purpose, a test current is applied to each lead, and the corresponding voltage is measured. Under normal conditions, the test current causes the turn-on of a diode-based protection structure that is present between the corresponding terminal and a reference terminal (maintained at a reference voltage, or ground, through the corresponding lead), so that the measured voltage takes an expected value equal to a clamping voltage of the protection structure (for example, a supply voltage of the electronic device). On the contrary, if the measured voltage takes a value different from the expected one, and in particular a higher value in the event of open-circuit or a null value in the event of a short-circuit, then the electronic device is detected as defective and is discarded.

However, the known continuity tests are not typically able to detect interruptions of only part of the connection wires to the corresponding terminals of a multiple-connection lead (for example, only one out of two). Indeed, in this case the multiple-connection lead remains connected to the other one of its terminals through the corresponding (intact) connection wire. Therefore, the test current still causes the turn-on of the protection structure of the terminal connected to the lead through the intact connection wire, so that the measured voltage still takes the expected value. Consequently, an electronic device being defective for this reason passes the open/short test in any case, and may be detected (indirectly) only during the next parametric or functional tests.

This causes an increase of the test costs of electronic devices, since it involves the execution of the (complex) parametric or functional tests on such defective electronic devices. Furthermore, it is more difficult (if not impossible) to determine the actual cause of each failure of the parametric or functional tests. In any case, a risk exists that some interruptions of the connection wires might not be detected by the parametric or functional tests in specific situations. All of the above may have a negative effect on the production quality of the electronic devices.

These drawbacks may be particularly important in certain specific conditions. For example, in the case of electronic devices that contain a non-volatile memory of the Few Time Programmable (FTP) type, the electronic devices are supplied by the manufacturers with the non-volatile memories completely erased to be programmed in the field only once by the customers—for example, for applications of the automotive type. As a result, the manufacturers only perform the open/short test of these electronic devices, whereas the functional or parametric tests are performed by the customers after their programming. In this case, the electronic devices being defective because of interruptions of only part of the connection wires to the terminals of a multiple-connection lead may be detected only by the customers during the parametric or functional tests. This may cause the return of the defective electronic devices from the customers to the manufacturers, with a resulting increase of the production costs and a decrease of customer satisfaction.

SUMMARY OF THE INVENTION

In general terms, the embodiments of the present invention are based on exploiting corresponding single-connection leads for testing the different electrical connections to each multiple-connection lead.

More specifically, embodiments provide an electronic device with a set of first leads (each one electrically connected to a first terminal) and a set of second leads (each one electrically connected to a plurality of second terminals). For each second lead, a test structure is coupled between each one of its second terminals and a test first terminal, with the test structure that is configurable in a test condition (for testing the corresponding electrical connection through the second lead and the test first lead) or in an operative condition (for not interfering with a normal operation of the second lead and the test first lead).

Another aspect provides an electronic component for use in such an electronic device. Another aspect provides a system comprising one or more of such electronic devices. Another aspect provides a method for testing such an electronic device.

BRIEF DESCRIPTION OF THE DRAWINGS

The embodiments, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION OF THE EMBODIMENTS

Figure 1:
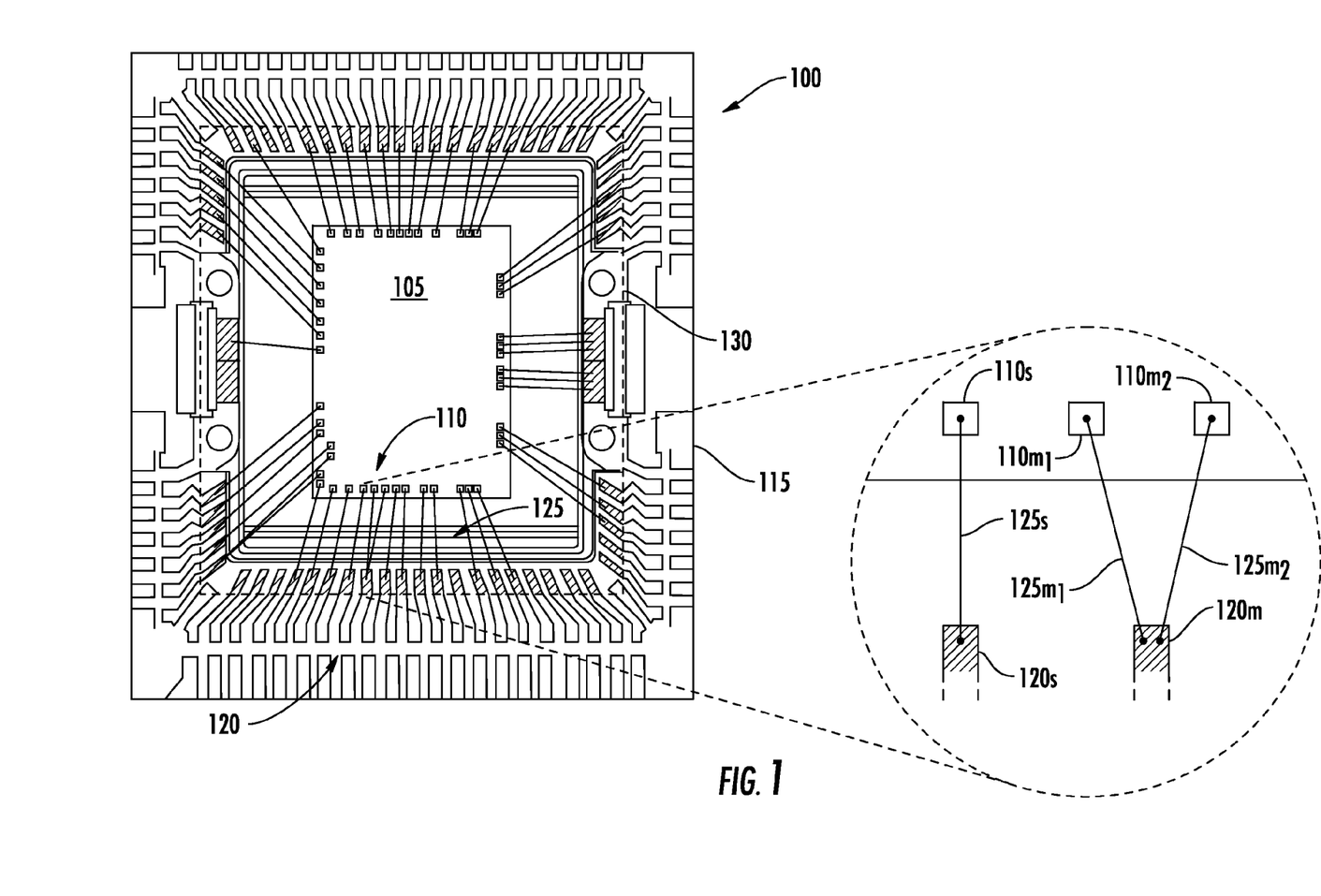
FIG. 1 shows a schematic representation of an electronic device according to an embodiment of the invention.

With reference in particular to FIG. 1, a schematic representation is shown of an electronic device 100 in which the approach according to an embodiment of this disclosure may be applied.

The electronic device 100 comprises a die 105 of semiconductor material on which various electronic components are integrated (for example, a non-volatile FTP memory with an array of memory cells and respective control circuits, not shown in the figure). The die 105 exposes a plurality of terminals 110 of these electronic components on a front surface thereof—for example, in the form of conductive pads. The die 105 is mounted on a lead-frame 115. The lead-frame 115 is formed by a plate of metallic material (for example, copper), which is sheared so as to define a support structure inside of which a die is arranged and connected to the support structure by interconnection bars (tie-bars), and from which a plurality of leads 120 protrude.

Connection wires 125 of a metallic material (for example, gold) electrically connect the terminals 110 to the leads 120. In particular, in the case of a single-connection lead (differentiated by the reference 120s), a connection wire (differentiated by the reference 125s) connects the lead 120s to a single terminal (differentiated by the reference 110s). In the case instead of a multiple-connection lead, and in particular of the double type (differentiated by the reference 120m), two (or more) connection wires (differentiated with the references $125m_1$ and $125m_2$) connect the lead 120m to corresponding terminals (differentiated with the reference $110m_1$ and $110m_2$, respectively). The die 105 and an inner portion of the leads 120 (on which the connection wires 125 are fixed) are embedded into a protective package 130 of insulating material (for example, a plastic resin). The protective package 130 is separated from the support structure of the lead-frame 115 by cutting the interconnect bars flush with it and the leads 120 at their outer ends (so that they protrude from the protective package 130).

Figure 2:
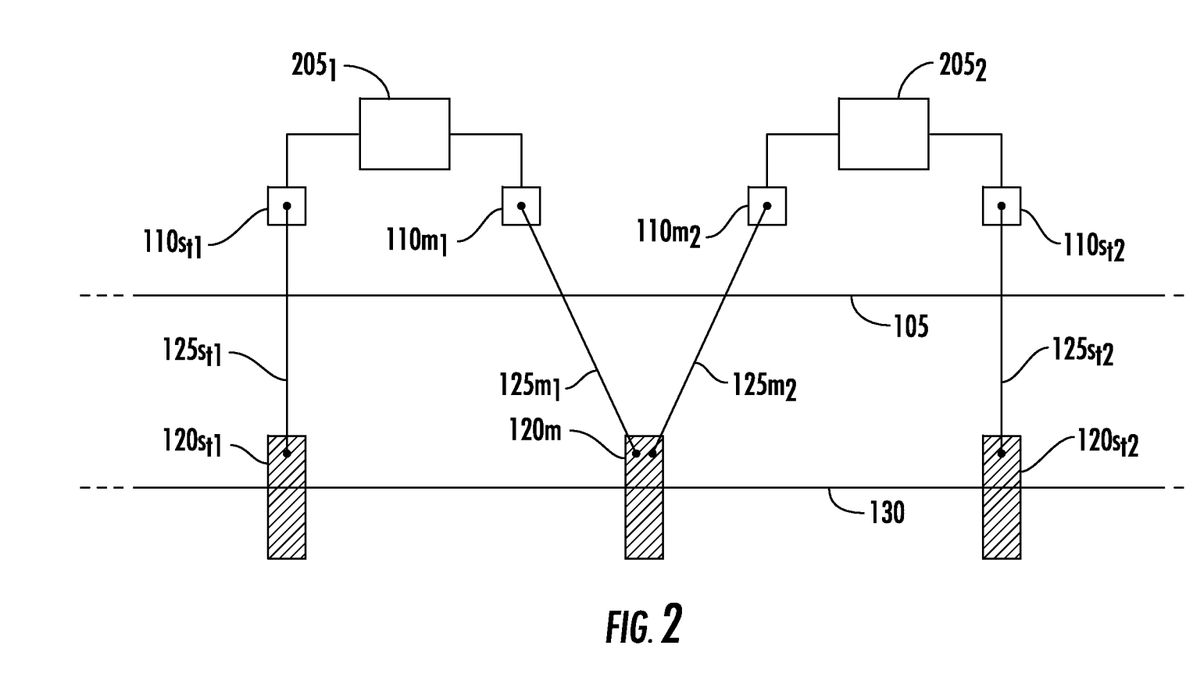
FIG. 2 shows a functional representation of an embodiment of the invention.

A functional representation according to an embodiment is shown in the FIG. 2. In this case, for each multiple-connection lead 120m a plurality of test structures $205_1, 205_2$ (equal in number to the corresponding terminals $110m_1$, $110m_2$—i.e., two in the example at issue) are added within the die 105. Each test structure $205_1, 205_2$ is coupled between the corresponding terminal $110m_1, 110m_2$ and one of the terminals connected to a single-connection lead (hereinafter referred to as test terminal). In particular, the test structure $205_1$ is coupled between the terminal $110m_1$ and a terminal $110s_{t1}$ (which in turn is connected to a lead $120s_{t1}$ through a connection wire $125s_{t1}$), and the test structure $205_2$ is coupled between the terminal $110m_2$ and a terminal $110s_{t2}$ (which in turn is connected to a lead $120s_{t2}$ through a connection wire $125s_{t2}$). For example, the terminal $110s_{t1}, 110s_{t2}$ is the terminal (connected to a single-connection lead) being closest to the terminal $110m_1, 110m_2$. In this way, it is possible to simplify the electrical connection of the test structure $205_1, 205_2$ between the terminal $110m_1, 110m_2$ and the terminal $110s_{t1}$, $110s_{t2}$ inside the die 105.

As described in detail in the following, each test structure $205_1, 205_2$ is configurable in a test condition or in an operative condition. In the test condition, the test structure $205_1, 205_2$ allows testing the integrity of the connection wire $125m_1$, $125m_2$ through the lead 120m (in common between the two connection wires $125m_1, 125m_2$) and the lead $120s_{t1}, 120s_{t2}$ (corresponding to the connecting wire $125m_1, 125m_2$ at issue). In the operative condition, instead, the test structure $205_1, 205_2$ does not interfere with a normal operation of the lead 120m and the lead $120s_{t1}, 120s_{t2}$.

The above-described technique allows subjecting the electrical connections to the corresponding terminals of a multiple-connection lead as well to a continuity test (in order to verify their integrity). This entails a reduction of the test costs of the electronic devices, since it allows skimming the electronic devices before performing next tests being more complex (for example, of the parametric or functional type). Moreover, this has a positive effect on the production quality of the electronic devices, since it facilitates the determination of the actual cause of any defective electronic device that did not pass the continuity test. These advantages are particularly appreciated in certain specific conditions—for example, in the case at issue in which the electronic devices contain FTP non-volatile memories, so that they may be supplied by the manufacturers with the non-volatile memories completely erased to be programmed on the field only once by the customers (for example, for applications of the automotive type). Indeed, in this case it is possible to detect the electronic devices being defective because of interruptions of part only of the electrical connections to the terminals of a multiple-connection lead directly by the manufactures (thereby avoiding their return from the customers), with a reduction of the production costs and an increase of the customer satisfaction.

Figure 3:
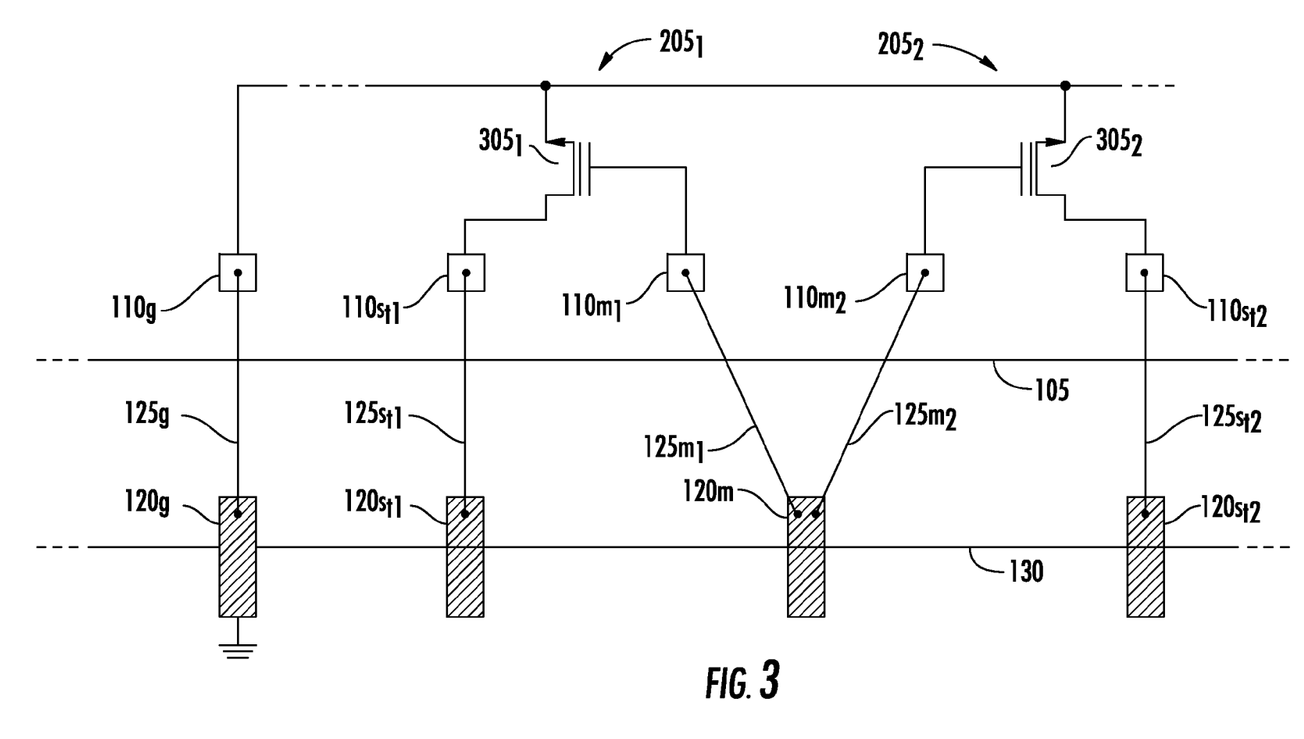
FIG. 3 shows an example of implementation of an embodiment of the invention.

An example of implementation of the approach according to an embodiment is shown in the FIG. 3. In this case, each test structure $205_1, 205_2$ comprises a (non-volatile) memory cell based on an (N channel) MOS transistor of the floating gate type, both denoted with the reference $305_1, 305_2$. The MOS transistor $305_1, 305_2$ has a gate terminal coupled with the terminal $110m_1, 110m_2$, a drain terminal coupled with the terminal $110s_{t1}, 110s_{t2}$, and a source terminal coupled with another terminal 110g (hereinafter referred to as reference terminal), which in turn is connected to a single-connection lead 120g through a connection wire 125g in order to receive the reference voltage. The MOS transistor $305_1, 305_2$ has a threshold voltage that depends on an electric charge within its floating gate. Different levels of the threshold voltage represent corresponding logic values. Conventionally, the memory cell $305_1, 305_2$ is in an erased state corresponding to a logic value 1 when it has a low threshold voltage (for example, 0-0.5 V) and it is in a programmed state corresponding to a logic value 0 when it has a high threshold voltage (for example, 7-8V).

In the test condition, all the memory cells $305_1, 305_2$ are erased. The integrity of each connection wire $125m_1, 125m_2$ is verified by reading the corresponding memory cell $305_1$, $305_2$. This operation may be performed either in succession or concurrently (since the two memory cells $305_1$ and $305_2$ do not interact with each other despite the connection between their gate terminals through the lead $120m$). For this purpose, the reference voltage is applied to the lead $110g$, a drain reading voltage is applied to the lead $120s_{t1}, 120s_{t2}$ (for example, 1V), and a gate reading voltage is applied to the lead $120m$ (with a value between the low threshold voltage and the high threshold voltage—for example, 5V). The reference voltage and the drain reading voltage are always supplied to the source terminal and to the drain terminal, respectively, of the MOS transistor $305_1, 305_2$ through the connection wires $125g$ and $125s_{t1}, 125s_{t2}$, respectively (previously verified to be intact as usual). If the connection wire $125m_1, 125m_2$ is intact as well, the gate reading voltage is supplied to the gate terminal of the MOS transistor $305_1, 305_2$ through it. Since the memory cell $305_1, 305_2$ is erased, the voltage applied between the gate terminal and the source terminal (i.e., 5V) is higher than the low threshold voltage of the MOS transistor $305_1, 305_2$, so that it turns-on. As a result, a current (for example, of a few mA) flows between the lead $120s_{t1}, 120s_{t2}$ and the lead $120g$, so that the logic value 1 is read. On the contrary, if the connection wire $125m_1, 125m_2$ is interrupted, no voltage is supplied to the gate terminal of the MOS transistor $305_1, 305_2$. Therefore, the MOS transistor $305_1, 305_2$ remains off; as a result, no current flows between the lead $120s_{t1}, 120s_{t2}$ and the lead $120g$, so that the logic value 0 is read.

In the operative condition, instead, all the memory cells $305_1, 305_2$ are programmed. For this purpose, once the electronic device has passed the continuity test, the reference voltage is applied to the lead $110g$, a drain programming voltage is applied to the lead $120s_{t1}, 120s_{t2}$ (for example, 4.5 V), and a gate programming voltage is applied to the lead $120m$ (for example, 12.5 V). The reference voltage, the drain programming voltage and the gate programming voltage are always supplied to the source terminal, the drain terminal and the gate terminal, respectively, of the MOS transistor $305_1, 305_2$ through the connection wires $125g$, $125s_{t1}, 125s_{t2}$ and $125m_1, 125m_2$, respectively (previously verified to be intact). This causes an injection of electrons into the floating gate of the MOS transistor $305_1, 305_2$, which injection brings its threshold voltage high. Therefore, in the normal condition of operation of the electronic device (assuming that the operative voltages applied to the lead $120m$ are below the high threshold voltage), the MOS transistor $305_1, 305_2$ is always off. In this way, the MOS transistor $305_1, 305_2$, in addition to being always seen as an open-circuit by the terminal $110m_1, 110m_2$, it is also seen as an open-circuit by the terminal $110s_{t1}, 110s_{t2}$ and by the terminal $120g$ (setting aside negligible leakage currents of the MOS transistor $305_1, 305_2$). In addition (assuming that the operative voltages applied between the leads $120m$ and $120s_{t1}, 120s_{t2}$ are lower than corresponding erasing voltages), the memory cell $305_1, 305_2$ always remains programmed during the normal operation of the electronic device. Consequently, the memory cell $305_1, 305_2$ (once programmed) is completely opaque to the normal operation of the electronic device.

The above-described implementation with the test structure based on the memory cell is very reliable. Indeed, the test structure may be brought to the operative condition in a simple and safe way (without much risk of damage to the electronic device). Furthermore, the particular arrangement of the memory cell (with the gate terminal directly connected to the terminal of the multiple-connection lead) makes its reading and programming even safer.

Figure 4:
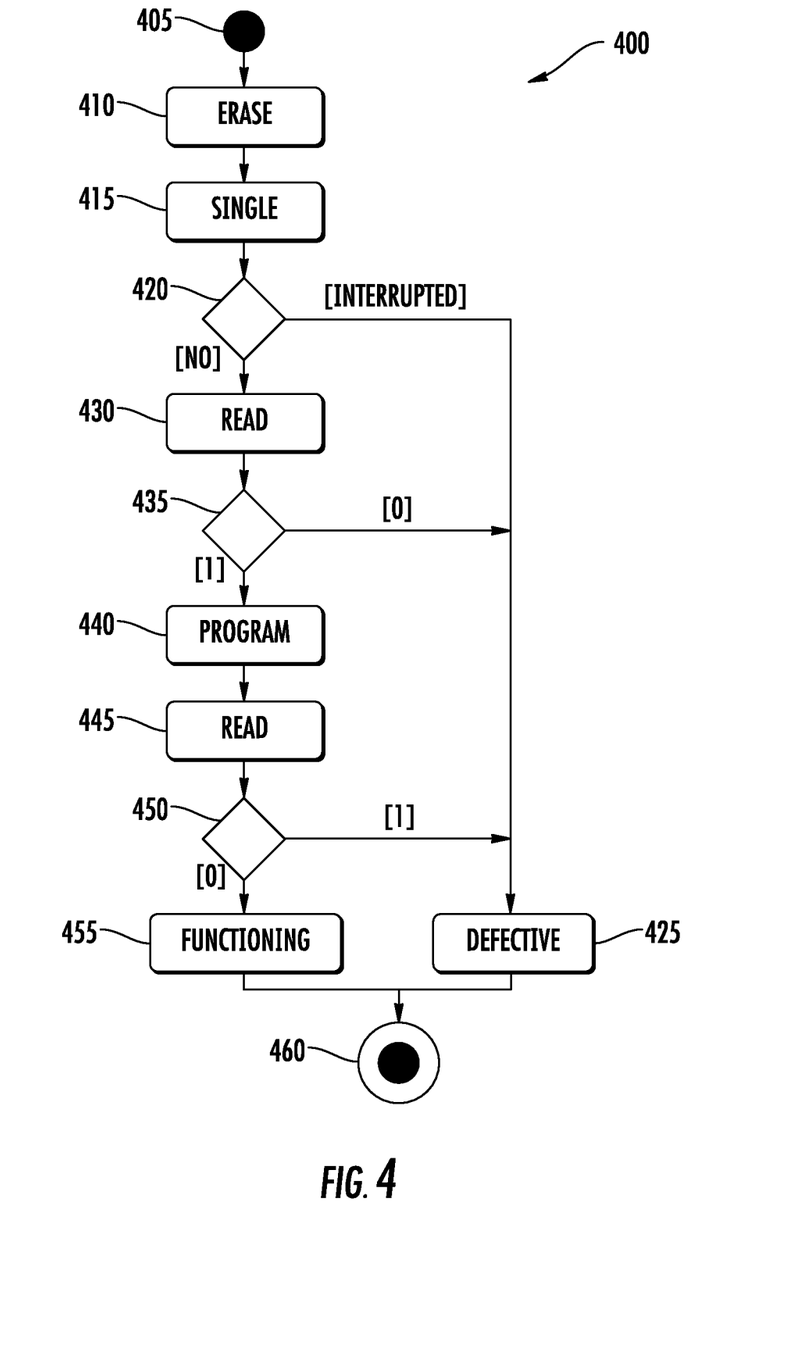
FIG. 4 shows a flow chart describing a test procedure relating to such implementation according to an embodiment of the invention.

With reference now to the FIG. 4, a flow chart is shown describing a test procedure relating to such implementation according to an embodiment. Particularly, the diagram represents a continuity test of the electronic device with a method 400.

The method begins at the start black circle 405, and then passes to block 410 wherein all the memory cells of the electronic device are erased (for example, by irradiating the die with ultraviolet light prior to its embedding into the package). Continuing to block 415, the integrity of the connection wires of the single-connection leads is verified as usual, in succession and/or in parallel (for example, by applying a test current to each one of these leads and measuring the corresponding voltage, with the corresponding connection wire that is deemed intact if the measured voltage takes an expected value equal to a clamping voltage of a diode-based protection structure present between the corresponding terminal and the reference terminal, and it is deemed interrupted if the measured voltage takes a higher value). The flow of activity branches at block 420 according to the result of this verification. If one or more of the connection wires of the single-connection leads are interrupted, the electronic device is determined to be defective at block 425 (and it is then discarded since it did not pass the continuity test).

On the contrary, the integrity of the connection wires of the multiple-connection leads is verified by performing the following operations in succession on each one of them and/or in parallel on all or part of them. Particularly, for each multiple-connection wire the corresponding memory cell is read at block 430. The flow of activity branches at block 435 according to the result of this reading. If the logic value 0 is read (since the corresponding connection wire is interrupted), in this case as well the electronic device is determined to be defective at the block 425 (and it is then discarded).

If instead the logic value 1 is read (since the corresponding connection wire is intact), the method continues to block 440 wherein the memory cell is programmed. The memory cell is read again at block 445. The flow of activity branches at block 450 according to the result of this further reading. If the logic value 1 is read (since the memory cell has not been programmed), in this case as well the electronic device is determined to be defective at the block 425 and it is then discarded (since the erased memory cell would interfere with its normal operation). If the logic value 0 is read (since the memory cell has been programmed correctly), the electronic device is determined to be functioning at block 455 (and it is then accepted since it has passed the continuity test).

In any case, the method ends to the final black and white concentric circles 460, which are reached from the block 425 (as soon as there is determined that any one of the connection wires is interrupted, and then the electronic device is defective) or from the block 455 (when there is determined that all the connection wires are intact, and then the electronic device is functioning).

The above-described algorithm allows determining the connection wires that are interrupted (for both the single-connection leads and the multiple-connection leads), and at the same time allows ensuring that in every functioning electronic device the memory cells of all the test structures have been properly programmed (and then they no longer interfere with its normal operation).

Figure 5:
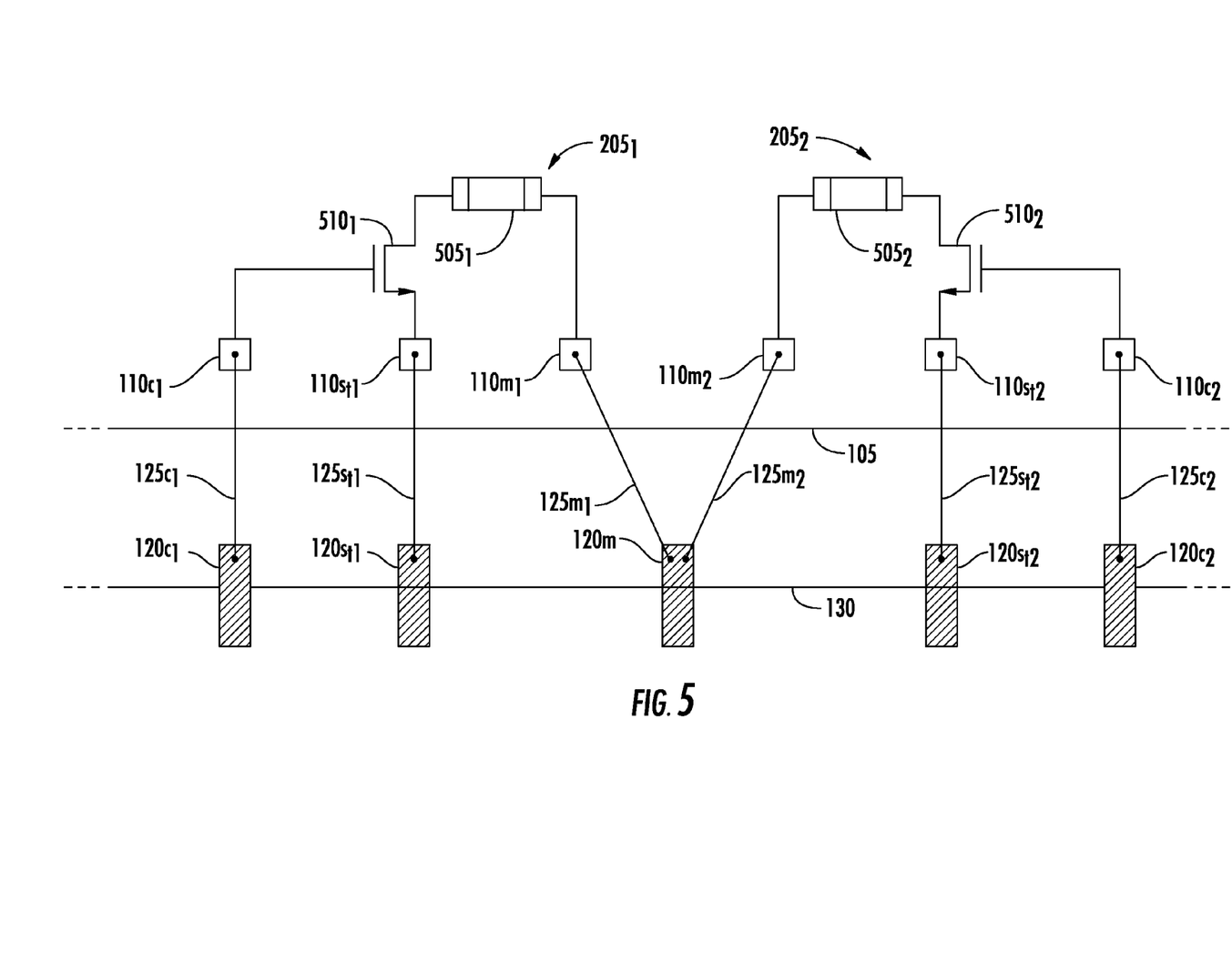
FIG. 5 shows a further example of implementation of an embodiment of the invention.

A further example of implementation of the approach according to an embodiment is shown in FIG. 5. In this case, each test structure $205_1, 205_2$ comprises a fuse $505_1, 505_2$ and an (N channel) MOS transistor $510_1, 510_2$ being connected in series. Particularly, the fuse $505_1, 505_2$ has a terminal coupled with the terminal $110m_1, 110m_2$ and another terminal coupled with a drain terminal of the MOS transistor $505_1, 505_2$, which has a source terminal coupled with the terminal $110s_{t1}, 110s_{t2}$ and a gate terminal coupled with another terminal $110c_1$, $110c_2$ (hereinafter referred to as a control terminal), which in turn is connected to a single-connection lead $120c_1,120c_2$ through a connection wire $125c_1,125c_2$.

In the test condition, all the fuses $505_1,505_2$ are conductive (so as to define corresponding short-circuits). The integrity of the two connection wires $125m_1$ and $125m_2$ (connected to the same lead $120m$) is verified in the alternative to avoid possible measurement interactions caused by the two fuses $505_1$ and $505_2$ connected to each other through the lead $120m$. For this purpose, starting from the connection wire $125m_1$ (dual considerations apply to the other connection wire $125m_2$), the reference voltage is applied to the corresponding lead $120s_{t1}$ and a conduction voltage is applied to the lead $120m$ (for example, 1V). At the same time, a turn-on voltage is applied to the corresponding lead $120c_1$ (with a value greater than a threshold voltage of the MOS transistors $505_1,505_2$—for example, 2V). The reference voltage and the turn-on voltage are always supplied to the source terminal and to the gate terminal, respectively, of the MOS transistor $510_1$ through the connection wires $125s_{t1}$ and $125c_1$, respectively (previously verified to be intact as usual), so that the MOS transistor $510_1$ is turned-on (so as to define another short-circuit). On the contrary, the reference voltage is applied to the lead $120s_{t2}$ and to the lead $120c_2$ corresponding to the other connection wire $125m_2$. The reference voltage is always supplied to the source terminal and to the gate terminal of the MOS transistor $510_2$ through the connection wires $125s_{t2}$ and $125c_2$, respectively (previously verified to be intact as usual), so that the MOS transistor $510_2$ is turned off (so as to define an open-circuit). In this way, the test structure $205_2$ is seen as an open-circuit by the lead $120m$, so that it is completely opaque to the operation of the test structure $205_1$ of the connection wire $125m_1$ to be verified. If the connection wire $125m_1$ is intact, a short-circuit current flows from the lead $120s_{t1}$ to the lead $120m$ (through the fuse $505_1$ and the MOS transistor $510_1$). On the contrary, if the connection wire $125m_1$ is interrupted, no current flows between the leads $120s_{t1}$ and $120m$.

In the operative condition, instead, all the fuses $505_1,505_2$ are burned. For this purpose, once the electronic device has passed the continuity test, the reference voltage is applied to each lead $120m_1,120m_2$, a burning voltage is applied to the lead $120m$ (for example, 20V), and the turn-on voltage is applied to each lead $120c_1,120c_2$. The reference voltage and the turn-on voltage are always supplied to the source terminal and to the gate terminal, respectively, of each MOS transistor $510_1,510_2$ through the connection wires $125s_{t1},125s_{t2}$ and $125c_1,125c_2$, respectively, so that the transistor MOS $510_1$, $510_2$ is turned-on (so as to define a short-circuit); at the same time, the terminals of each fuse $510_1,510_2$ always receive the reference voltage applied to the lead $120s_{t1},120s_{t2}$ (through the connection wire $125s_{t1},125s_{t2}$ and the turned-on MOS transistor $510_1,510_2$) and the burning voltage applied to the lead $120m$ (through the connection wire $125m_1,125m_2$ previously verified to be intact). This causes the fuse $505_1,505_2$ to burn, so as to define a corresponding open-circuit. Therefore, in the normal condition of operation of the electronic device the test structure $205_1,205_2$, in addition to being always seen as an open-circuit by the lead $120c_1,120c_2$, is also seen as an open circuit by the lead $120s_{t1},120s_{t2}$ and by the lead $120m$ (setting aside negligible leakage currents of the fuse $505_1$, $505_2$ and of the MOS transistor $510_1,510_2$). Consequently, the test structure $205_1,205_2$ (once the fuse $505_1,505_2$ has been burned) is completely opaque to the normal operation of the electronic device.

The above-described implementation does not require the availability of non-volatile memory cells, so that it is applicable to any type of electronic device (even when it is manufactured with a technology incompatible with the making of floating-gate MOS transistors).

Figure 6:
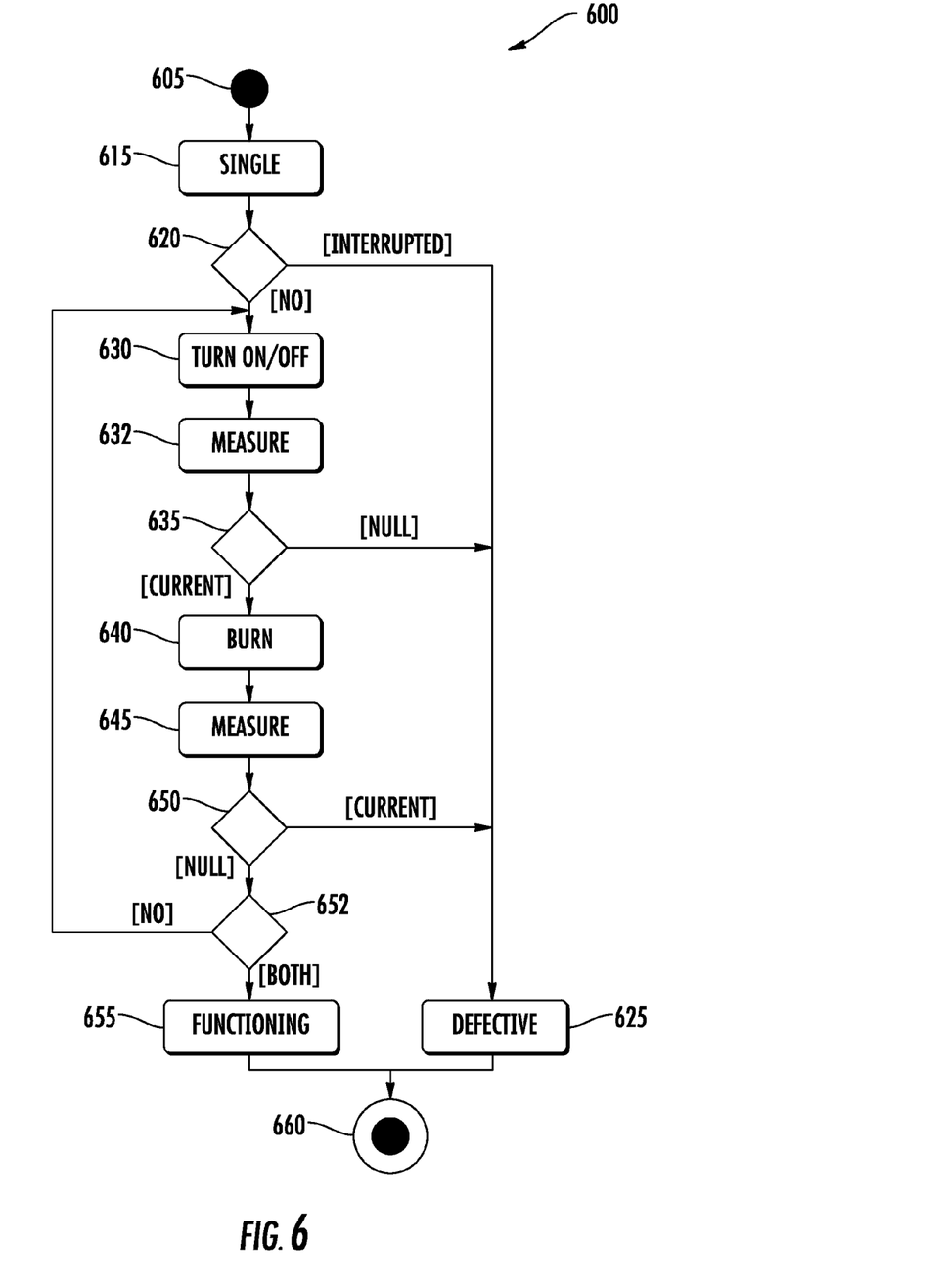
FIG. 6 shows a flow chart describing a test procedure relating to such further implementation according to an embodiment of the invention.

With reference now to the FIG. 6, a flow chart is shown describing a test procedure relating to such implementation according to an embodiment. Particularly, the diagram represents a continuity test of the electronic device with a method 600.

The method begins at the start black circle 605, and then passes to block 615 wherein the integrity of the connection wires of the single-connection leads is verified as above (in succession and/or in parallel). The flow of activity branches at block 620 according to the result of this verification. If one or more of the connection wires (of the single-connection leads) are interrupted, the electronic device is determined to be defective at block 625 (and it is then discarded since it did not pass the continuity test).

On the contrary, the integrity of the connection wires of the multiple-connection leads is verified, by repeating twice the following operations in succession on each of them and/or in parallel on all or part of them (a first time for one of the connection wires of each multiple-connection wire and a second time for another of the connection wires of each multiple-connection lead). In particular, at the first repetition the MOS transistor corresponding to the connection wire to be tested is turned on while the MOS transistor corresponding to the other connection wire is turned off at block 630. Continuing to block 632, the conduction voltage is applied between the multiple-connection lead and the corresponding test lead, and the current flowing between the pair of leads is measured. The flow of activity branches at block 635 according to the result of this measure. If the measured current is zero, or more precisely less than a threshold value such as 10-50 mA (since the connection wire is interrupted), in this case as well the electronic device is determined to be defective at the block 625 (and it is then discarded).

If instead the measured current is high, i.e., greater than this threshold value (since the connection wire is intact), the method continues to block 640 wherein the corresponding fuse is burned (by applying the burning voltage between the same pair of leads). The conduction voltage is again applied between the same pair of leads and the current flowing between them is measured at block 645. The flow of activity branches at block 650 according to the result of this further measure. If the measured current is still high (because the fuse has not been burned), in this case as well the electronic device is determined to be defective at the block 625 and it is then discarded (since the non-burned fuse would interfere with its normal operation). If instead the measured current is low (because the fuse has been properly burned), the method continues to block 652. In this phase, a test is performed to verify whether both the connection wires of the multiple-connection lead have been verified. If not, the method returns to the block 630 to repeat the same operations for the other connection wire of the multiple-connection lead. Once both the connection wires of the multiple-connection leads have been verified, the method passes from the block 652 to block 655 wherein the electronic device is determined to be functioning (and it is then accepted since it has passed the continuity test).

In any case, the method ends at the final black and white concentric circles 660, which are reached from the block 625 (as soon as there is determined that any one of the connection wires is interrupted, and then the electronic device is defective) or from the block 655 (when there is determined that all the connection wires are intact, and then the electronic device is functioning).

As above, this algorithm allows determining the connection wires that are interrupted and at the same time ensuring that in each functioning electronic device all the fuses have been properly burned (and then they no longer interfere with its normal operation).

Naturally, to satisfy local and specific requirements, a person skilled in the art may apply to the approach described above many logical and/or physical modifications and alterations. More specifically, although this approach has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical values) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any embodiment of the disclosed approach may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variable involved), and the term a/an should be intended as one or more items (unless expressly indicated otherwise).

For example, an embodiment provides an electronic device comprising at least one electronic component, which has a plurality of terminals comprising a set of (one or more) first terminals and a set of (one or more) second terminals. The electronic device comprises a protective package embedding the at least one electronic component. The electronic device comprises a plurality of leads that are exposed from the protective package, which leads comprise a set of (one or more) first leads and a set of (one or more) second leads. For each first lead the electronic device comprises a first electrical connection inside the protection package between the first lead and a corresponding one of the first terminals. For each second lead the electronic device comprises a plurality of (two or more) second electrical connections inside the protective package each one between the second lead and a corresponding one of the second terminals. In the approach according to an embodiment, for each second lead the at least one electronic component comprises a plurality of test structures; each test structure is coupled between a corresponding one of the second terminals connected to the second lead and a corresponding test one of the first terminals connected to a test one of the first leads. The test structure is configurable in a test condition for testing the corresponding second electrical connection through the second lead and the test first lead; otherwise, the test structure is configurable in an operative condition for not interfering with a normal operation of the second lead and the test first lead.

However, the electronic device may be of any type, shape and size, and it may contain any number of electronic components (distributed in any number, even only one, on any number of dice), which electronic devices may be of any type (see below). The leads may be of any type, shape, size, and in any position and number. Each electrical connection between the leads and the terminals may be of any other type (for example, with more wires in parallel for each lead, with conductive tapes, and so on). Each test structure may be of another type, coupled between the corresponding second terminal and first test terminal in another way, and configurable into different test and operative conditions (see below).

In an embodiment, the first test terminal is the first terminal being closest to the second terminal.

However, the possibility of coupling each test structure with another one of the first terminals (at any position) is not excluded.

In an embodiment, the test structure comprises a non-volatile memory cell. The memory cell has a conduction terminal coupled with the first test terminal, a further conduction terminal coupled with a reference one of the first terminals connected to a reference one of the first leads, and a control terminal coupled with the second terminal. In the test condition the memory cell is erased with a low threshold voltage and in the operative condition the memory cell is programmed with a high threshold voltage (higher than the low threshold voltage in absolute value).

However, the memory cell may be of another type (for example, an EPROM or phase change memory cell), it may have other conduction terminals (for example, reversed source/drain in a P-channel MOS transistor), and it may have different threshold voltages (even corresponding to different conditions thereof). In addition, the memory cell may be arranged in a different way (for example, reversing the connections between the second terminal and the first test terminal).

In an embodiment, the test structure comprises an interconnection element coupled between the second terminal and the first test terminal. The interconnection element electrically connects the second terminal and the first test terminal in the test condition and electrically insulates the second terminal and the first test terminal in the operative condition.

However, the interconnection element may be of another type and arranged in another way (see below). In addition, the electrical connection and the electrical insulation between the second terminal and the first test terminal may be defined in a different way (for example, with a resistance between them at very low value and very high value, respectively).

In an embodiment, the interconnection element comprises a fuse. The fuse is conductive to define a short-circuit in the test condition and it is burned to define an open-circuit in the operative condition. The fuse is burnable (blowable) by applying a burning voltage between the second lead and the test first lead.

However, the fuse may be replaced by any other equivalent interconnection element (for example, again a non-volatile memory cell but this time connected between the second terminal and the first test terminal).

In an embodiment, the test structure further comprises an electronic switch. The electronic switch has a conduction terminal coupled with the first test terminal, a further conduction terminal coupled with the interconnection element, and a control terminal coupled with a corresponding control one of the first terminals. The control terminal is connected to a control one of the first leads to receive a closing voltage (to close the electronic switch during the test of the corresponding second electrical connection) and an opening voltage (to open the electronic switch during the test of each other one of the second electrical connections).

However, the electronic switch may be of any other type and it may have other conduction terminals (for example, reversed source/drain in a P-channel MOS transistor, or collector/emitter in a BJT transistor). In any case, such feature may also be omitted (when the possible interference between the two fuses of each second terminal does not create substantial measurement problems).

Another embodiment provides an electronic component for use in such electronic device. The electronic component has the plurality of terminals comprising the set of first terminals and the set of second terminals. The electronic component comprises the test structures, each one coupled between the corresponding second terminal and the corresponding first test terminal.

However, the electronic component may be of any type (for example, a microprocessor, a power component, and so on), and it may have any number and type of terminals. The above-described approach may be part of the design of an integrated circuit. The design may also be created in a hardware description language; moreover, if the designer does not manufacture the dies or the masks, the design may be transmitted by physical means to others. In any case, the resulting integrated circuit may be distributed by its supplier in raw wafer form, as a bare die, or directly in the corresponding protection package.

Another embodiment provides a system comprising one or more of such electronic devices. However, this system may be of any type (for example, an electronic board for automotive applications, a cellular telephone, and so on).

Generally, similar considerations apply if the electronic device, the electronic component and/or the system each has a different structure or comprises equivalent components (for example, of different materials), or it has other operative characteristics. In any case, every component thereof may be separated into more elements, or two or more components may be combined together into a single element. Moreover, each component may be replicated to support the execution of the corresponding operations in parallel. Moreover, unless specified otherwise, any interaction between different components generally does not need to be continuous, and it may be either direct or indirect through one or more intermediaries.

Another embodiment provides a method for testing an electronic device (comprising at least one electronic component having a plurality of terminals comprising a set of first terminals and a set of second terminals, a protective package embedding the at least one electronic component, a plurality of leads exposed from the protective package comprising a set of first leads and a set of second leads, for each first lead a first electrical connection inside the protection package between the first lead and a corresponding one of the first terminals, and for each second lead a plurality of second electrical connections inside the protective package each one between the second lead and a corresponding one of the second terminals). In the approach according to an embodiment, for each second lead the at least one electronic component comprises a plurality of test structures (each test structure being coupled between a corresponding one of the second terminals connected to the second lead and a corresponding test one of the first terminals connected to a test one of the first leads). The method comprises the following steps. Each second electrical connection is tested through the corresponding second lead and test first lead with the corresponding test structure configured in a test condition. Each test structure is then switched from the test condition to an operative condition for not interfering with a normal operation of the corresponding second lead and test first lead.

However, each second electrical connection may be tested in any way through the respective leads, and each test structure may be switched in any way (see below).

In an embodiment, each test structure comprises a non-volatile memory cell (having a conduction terminal coupled with the corresponding first test terminal, a further conduction terminal coupled with a reference one of the terminals coupled with a reference one of the first leads, and a control terminal coupled with the corresponding second terminal). The step of testing each second electrical connection comprises reading each memory cell (being erased with a low threshold voltage) by applying a reference voltage to the reference lead and a reading voltage between the corresponding second lead and test first lead to detect a reading current between the corresponding second lead and test first lead. The step of switching each test structure comprises programming each memory cell (to a high threshold voltage higher than the low threshold voltage in absolute value) by applying the reference voltage to the reference lead and a programming voltage between the corresponding second lead and first test pin.

However, the memory cells may be read and/or programmed by applying voltages of different values. In addition, the memory cell may be in different states in the test condition and in the operative condition, which states may be detected in any other way.

In an embodiment, the method further comprises the step of reading each programmed memory cell by applying the reference voltage to the reference lead and the reading voltage between the corresponding second lead and test first lead to detect no reading current between the corresponding second lead and test first lead.

However, this operation is not strictly necessary and it may also be omitted (for example, when the programming of the memory cells is sufficiently safe).

In an embodiment, each test structure comprises an interconnection element coupled between the corresponding second terminal and first test terminal. The step of testing each second electrical connection comprises testing an electrical connection through each interconnection element in the test condition between the corresponding second lead and test first lead. The step of switching each test structure comprises switching each interconnection element to electrically insulate the corresponding second lead and test first lead.

However, the verification of the electrical connection and/or the switching of the interconnection element may be performed in any way (see below).

In an embodiment, each interconnection element comprises a fuse. The step of verifying an electrical connection through each interconnection element comprises applying a conduction voltage between the corresponding second lead and test first lead to detect a short-circuit current between the corresponding second lead and test first lead through the corresponding conductive fuse defining a short-circuit. The step of switching each interconnection element comprising applying a burning voltage between the corresponding second lead and test first lead to burn the corresponding fuse to define an open-circuit.

However, in the case the fuse is replaced by a non-volatile memory cell, the verification of the electrical connection may be performed by biasing it for reading and its switching may be performed by programming it.

In an embodiment, the method further comprises the step of applying the verification voltage for each fuse between the corresponding second lead and test first lead to detect no short-circuit current between the corresponding second lead and test first lead through the burned fuse.

However, as above this operation is not strictly necessary and it may also be omitted (for example, when the burning of the fuses is sufficiently safe).

In an embodiment, each test structure further comprises an electronic switch (having a conduction terminal coupled with the corresponding first test terminal, a further conduction terminal coupled with the corresponding interconnection element, and a control terminal coupled with a corresponding control one of the first terminals connected to a control one of the leads). The step of testing each second electrical connection further comprises applying a closing voltage to the control lead corresponding to one of the second electrical connections to be tested of each second lead for closing the corresponding electronic switch and applying an opening voltage to the control lead corresponding to each other one of the second electrical connections of the second lead for opening the corresponding electronic switch.

However, the electronic switch may be opened/closed in any other way and with any other control voltages/currents. Furthermore, it is also possible to remove one of the electronic switches of each second lead (with the same result that is obtained by burning its fuse, after the verification of the corresponding second electrical connection, before the verification of the other second electrical connections). In any case, as above this feature may also be omitted.

Generally, similar considerations apply if the same approach is implemented with an equivalent method (by using similar steps with the same functions of more steps or portions thereof, removing some steps being non-essential, or adding further optional steps). Moreover, the steps may be performed in a different order, concurrently or in an interleaved way (at least in part).

That which is claimed:

1. An electronic device comprising:
   at least one electronic component comprising a set of first terminals and a set of second terminals;
   a protective package surrounding the at least one electronic component;
   a set of first leads and a set of second leads exposed from the protective package;
   a first electrical connection inside the protective package between each first lead and a corresponding one of the first terminals;
   a plurality of second electrical connections inside the protective package each one between the second lead and a corresponding one of the second terminals;
   said at least one electronic component comprising a plurality of test structures for each second lead, each test structure being coupled between a corresponding one of the second terminals connected to the second lead and a corresponding test one of the first terminals connected to a test one of the first leads;
   each test structure being configurable in a test condition for testing the corresponding second electrical connection through the second lead and the test first lead or in an operative condition for not interfering with a normal operation of the second lead and the test first lead.

2. The electronic device according to claim 1 wherein the first test terminal is the first terminal being closest to the second terminal.

3. The electronic device according to claim 1 wherein each test structure comprises a non-volatile memory cell having a conduction terminal coupled with the first test terminal, a further conduction terminal coupled with a reference one of the first terminals connected to a reference one of the first leads, and a control terminal coupled with the second terminal.

4. The electronic device according to claim 3 wherein in the test condition the memory cell is erased with a low threshold voltage and in the operative condition the memory cell is programmed with a high threshold voltage higher than the low threshold voltage in absolute value.

5. The electronic device according to claim 1 wherein each test structure comprises an interconnection element coupled between the second terminal and the first test terminal.

6. The electronic device according to claim 5 wherein the interconnection element electrically connects the second terminal and the first test terminal in the test condition and electrically insulates the second terminal and the first test terminal in the operative condition.

7. The electronic device according to claim 5 wherein the interconnection element comprises a fuse being conductive to define a short-circuit in the test condition and being burned to define an open-circuit in the operative condition, the fuse being burnable by applying a burning voltage between the second lead and the test first lead.

8. The electronic device according to claim 5 wherein each test structure further comprises an electronic switch having a conduction terminal coupled with the first test terminal, a further conduction terminal coupled with the interconnection element, and a control terminal coupled with a corresponding control one of the first terminals connected to a control one of the first leads to receive a closing voltage to close the electronic switch during the test of the corresponding second electrical connection and an opening voltage to open the electronic switch during the test of each other one of the second electrical connections of the second lead.

9. An electronic device comprising:
   an electronic component comprising a set of first terminals and a set of second terminals;
   a protective package surrounding the electronic component;
   a set of first leads and a set of second leads exposed from the protective package;
   a first electrical connection inside the protective package between each first lead and a corresponding one of the first terminals;
   a plurality of second electrical connections inside the protective package each one between the second lead and a corresponding one of the second terminals;
   said electronic component comprising a plurality of test structures for each second lead, each test structure being coupled between a corresponding one of the second terminals connected to the second lead and a corresponding test one of the first terminals connected to a test one of the first leads;
   each test structure comprising a non-volatile memory cell being selectively configurable in a test condition for testing the corresponding second electrical connection through the second lead and the test first lead.

10. The electronic device according to claim 9 wherein the first test terminal is the first terminal being closest to the second terminal.

11. The electronic device according to claim 9 wherein each non-volatile memory cell has a conduction terminal coupled with the first test terminal, a further conduction terminal coupled with a reference one of the first terminals connected to a reference one of the first leads, and a control terminal coupled with the second terminal.

12. The electronic device according to claim 11 wherein in the test condition the memory cell is erased with a low threshold voltage and in an operative condition the memory cell is programmed with a high threshold voltage higher than the low threshold voltage in absolute value.

13. An electronic device comprising:
   an electronic component comprising a set of first terminals and a set of second terminals;

a protective package;
a set of first leads and a set of second leads exposed from the protective package;
a first electrical connection inside the protective package between each first lead and a corresponding one of the first terminals;
a plurality of second electrical connections inside the protective package each one between the second lead and a corresponding one of the second terminals;
said electronic component comprising a plurality of test structures for each second lead, each test structure being coupled between a corresponding one of the second terminals connected to the second lead and a corresponding test one of the first terminals connected to a test one of the first leads;
each test structure comprises an interconnection element being configurable in a test condition for testing the corresponding second electrical connection through the second lead and the test first lead.

14. The electronic device according to claim 13 wherein the first test terminal is the first terminal being closest to the second terminal.

15. The electronic device according to claim 13 wherein the interconnection element electrically connects the second terminal and the first test terminal in the test condition and electrically insulates the second terminal and the first test terminal in an operative condition.

16. The electronic device according to claim 13 wherein the interconnection element comprises a fuse being conductive to define a short-circuit in the test condition and being burned to define an open-circuit in the operative condition, the fuse being burnable by applying a burning voltage between the second lead and the test first lead.

17. The electronic device according to claim 13 wherein each test structure further comprises an electronic switch having a conduction terminal coupled with the first test terminal, a further conduction terminal coupled with the interconnection element, and a control terminal coupled with a corresponding control one of the first terminals connected to a control one of the first leads to receive a closing voltage to close the electronic switch during the test of the corresponding second electrical connection and an opening voltage to open the electronic switch during the test of each other one of the second electrical connections of the second lead.

18. A method for testing an electronic device comprising at least one electronic component comprising a set of first terminals and a set of second terminals; a protective package; a set of first leads and a set of second leads exposed from the protective package; a first electrical connection inside the protective package between each first lead and a corresponding one of the first terminals; and a plurality of second electrical connections inside the protective package each one between the second lead and a corresponding one of the second terminals; the at least one electronic component comprising a plurality of test structures for each second lead, each test structure being coupled between a corresponding one of the second terminals connected to the second lead and a corresponding test one of the first terminals connected to a test one of the first leads; the method comprising:
testing each second electrical connection through the corresponding second lead and test first lead with the corresponding test structure configured in a test condition; and
switching each test structure from the test condition to an operative condition.

19. The method according to claim 18, wherein each test structure comprises a non-volatile memory cell having a conduction terminal coupled with the corresponding first test terminal, a further conduction terminal coupled with a reference one of the terminals coupled with a reference one of the first leads, and a control terminal coupled with the corresponding second terminal; and wherein testing each second electrical connection comprises reading each non-volatile memory cell, being erased with a low threshold voltage, by applying a reference voltage to the reference lead and a reading voltage between the corresponding second lead and test first lead to detect a reading current between the corresponding second lead and test first lead.

20. The method according to claim 19 wherein switching each test structure comprises programming each non-volatile memory cell, to a high threshold voltage higher than the low threshold voltage in absolute value, by applying the reference voltage to the reference lead and a programming voltage between the corresponding second lead and first test lead.

21. The method according to claim 20 further comprising reading each programmed non-volatile memory cell by applying the reference voltage to the reference lead and the read voltage between the corresponding second lead and test first lead to detect no reading current between the corresponding second lead and test first lead.

22. The method according to claim 19 wherein each test structure comprises an interconnection element coupled between the corresponding second terminal and first test terminal; and wherein testing each second electrical connection comprises testing an electrical connection through each interconnection element in the test condition between the corresponding second lead and test first lead.

23. The method according to claim 22 wherein switching each test structure comprises switching each interconnection element to electrically insulate the corresponding second lead and test first lead.

24. The method according to claim 23 wherein each interconnection element comprises a fuse; wherein testing an electrical connection through each interconnection element comprises applying a conduction voltage between the corresponding second lead and test first lead to detect a short-circuit current between the corresponding second lead and test first lead through the corresponding conductive fuse defining a short-circuit; and wherein switching each interconnection element comprising applying a burning voltage between the corresponding second lead and test first lead to burn the corresponding fuse to define an open-circuit.

25. The method according to claim 24 further comprising applying the conduction voltage for each fuse between the corresponding second lead and test first lead to detect no short-circuit current between the corresponding second lead and test first lead through the burned fuse.

26. The method according to claim 25 wherein each test structure further comprises an electronic switch having a conduction terminal coupled with the corresponding first test terminal, a further conduction terminal coupled with the corresponding interconnection element, and a control terminal coupled with a corresponding control one of the first terminals connected to a control one of the leads; and wherein testing each second electrical connection further comprises applying a closing voltage to the control lead corresponding to one of the second electrical connections to be tested of each second lead for closing the corresponding electronic switch and applying an opening voltage to the control lead corresponding to each other one of the second electrical connections of the second lead for opening the corresponding electronic switch.

* * * * *